(12) United States Patent
Lin

(10) Patent No.: US 10,120,611 B2
(45) Date of Patent: Nov. 6, 2018

(54) STORAGE DEVICE AND DATA CONTROL METHOD FOR STORAGE ERROR CONTROL

(71) Applicant: Silicon Motion, Inc., Jhubei, Hsinchu (TW)

(72) Inventor: Chih-Ming Lin, New Taipei (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/396,784

(22) Filed: Jan. 2, 2017

(65) Prior Publication Data

US 2017/0262219 A1 Sep. 14, 2017

(30) Foreign Application Priority Data

Mar. 14, 2016 (TW) .............................. 105107810 A

(51) Int. Cl.
*G06F 3/06* (2006.01)
*G06F 11/10* (2006.01)
*G11C 29/52* (2006.01)
*G11C 29/00* (2006.01)

(52) U.S. Cl.
CPC .......... *G06F 3/0647* (2013.01); *G06F 3/0619* (2013.01); *G06F 3/0679* (2013.01); *G06F 11/1048* (2013.01); *G06F 11/1068* (2013.01); *G11C 29/52* (2013.01); *G11C 29/74* (2013.01)

(58) Field of Classification Search
CPC ..... G06F 3/0614; G06F 3/0619; G06F 3/0679
USPC ........................................................... 711/103
See application file for complete search history.

(56) References Cited

U.S. PATENT DOCUMENTS

| 2010/0011154 | A1* | 1/2010 | Yeh | G06F 12/0246 711/103 |
| 2015/0012802 | A1* | 1/2015 | Avila | G06F 12/0246 714/773 |
| 2016/0124650 | A1* | 5/2016 | Chang | G06F 3/0604 711/103 |
| 2017/0060453 | A1* | 3/2017 | Kodera | G06F 3/0619 |

FOREIGN PATENT DOCUMENTS

TW 201314698 4/2013

* cited by examiner

*Primary Examiner* — Than Nguyen
(74) *Attorney, Agent, or Firm* — Chieh-Mei Wang

(57) ABSTRACT

A storage device includes a data storage medium and a control unit. The data storage medium includes a spare block pool including a plurality of spare blocks. Each spare block includes a plurality of data pages. The control unit is electrically coupled to the data storage medium. The control unit is configured to receive data from a host and to determine whether the data is sequential data according to a default policy. The data is written into at least two of the plurality of data pages in one of the plurality of spare blocks respectively. The control unit and a data storing method for the storage device are also provided.

18 Claims, 2 Drawing Sheets

STORAGE DEVICE AND DATA CONTROL METHOD FOR STORAGE ERROR CONTROL

FIELD OF THE INVENTION

The present invention relates to data storage technology, and more particularly to a storage device, a control unit thereof, and a data storing method for storage device.

BACKGROUND OF THE INVENTION

In general, storage device is mainly constituted by a control unit and a data storage medium (for example, a flash memory). The data storage medium includes a plurality of physical blocks, and each physical block includes a plurality of data pages. The control unit is electrically coupled to the data storage medium and configured to perform data write, data read or data erase on the data pages in the physical blocks.

However, the storage device may have data integrity issues caused by frequent data moving, defect in the manufacturing process and aging of data after long-term usage. Therefore, once data write is completed, the control unit of the storage device may use error correcting code (ECC) to perform a correcting operation on the data stored in the storage device. However, the correcting capability of the error correcting code has a limitation (e.g., 60 bits). Therefore, once the data stored in the data pages has an error greater than 60 bits, the stored data may not be corrected by the error correcting code and an error correcting code invalid issue would happen, leading to loss of validity of the data stored in the storage device.

SUMMARY OF THE INVENTION

One objective of the present invention is to provide a storage device. When performing a data write operation, the storage device would make a backup of the written data. Therefore, once any one of the two pieces of data has an error correcting code invalid issue, the storage device may select and store the other piece of data not having the error correcting code invalid issue. Or, if both of the two pieces of data have the error correcting code invalid issue, the storage device may integrate the data pages of the two pieces of data to form one piece of data without the error correcting code invalid issue. As a result, data loss is avoided.

Another objective of the present invention is to provide a control unit of a storage device. When performing a data write operation, the control unit would make a backup of the written data. Therefore, once any one of the two pieces of data has an error correcting code invalid issue, the control unit may select and store the other piece of data not having the error correcting code invalid issue. Or, if both of the two pieces of data have the error correcting code invalid issue, the control unit may integrate the data pages of the two pieces of data to form one piece of data without the error correcting code invalid issue. As a result, data loss is avoided.

Still another objective of the present invention is to provide a data storing method for a storage device. When performing a data write operation, the data storing method would make a backup of the written data. Therefore, once any one of the two pieces of data has an error correcting code invalid issue, the data storing method may select and store the other piece of data not having the error correcting code invalid issue. Or, if both of the two pieces of data have the error correcting code invalid issue, the data storing method may integrate the data pages of the two pieces of data to form one piece of data without the error correcting code invalid issue. As a result, data loss is avoided.

The present invention provides a storage device, which includes a data storage medium and a control unit. The data storage medium includes a spare block pool. The spare block pool includes a plurality of spare blocks. Each one of the plurality of spare blocks includes a plurality of data pages. The control unit is electrically coupled to the data storage medium. The control unit is configured to receive data from a host and to determine whether the data is sequential data according to a default policy. The data is written into at least two of the plurality of data pages in one of the plurality of spare blocks respectively.

The present invention further provides a control unit, which includes a control logic and a microprocessor. The control logic is electrically coupled to a data storage medium. The data storage medium includes a spare block pool. The spare block pool is for storing a plurality of spare blocks. Each one of the plurality of spare blocks includes a plurality of data pages. The microprocessor is electrically coupled to the control logic. The microprocessor is configured to receive data from a host and determine whether the data is sequential data. If the determination is true, the microprocessor is configured to write the data into at least two of the plurality of spare blocks via the control logic respectively. If the determination is false, the microprocessor is configured to write the data into at least two of the plurality of data pages in one of the plurality of spare blocks via the control logic respectively.

The present invention still further provides a data storing method for a storage device, which includes the steps of: receiving data from a host; determining whether the data is sequential data; if the determination is true, writing the data into at least two spare blocks respectively, wherein the at least two spare blocks are selected from a plurality of spare blocks of a spare block pool, and each one of the plurality of spare blocks comprises a plurality of data pages; or if the determination is false, writing the data into at least two of the plurality of data pages in one of the plurality of spare blocks in the spare block pool respectively.

In summary, when performing a data write operation, the present invention would make a copy of the written data. Therefore, once any one of the two pieces of data has an error correcting code invalid issue, the present invention may select and store the other piece of data not having the error correcting code invalid issue. Or, if both of the two pieces of data have the error correcting code invalid issue, the present invention may integrate the data pages of the two pieces of data to form one piece of data without the error correcting code invalid issue. As a result, data loss is avoided.

BRIEF DESCRIPTION OF THE DRAWINGS

Other advantages, objectives and features of the present invention will become apparent from the following description referring to the attached drawings.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
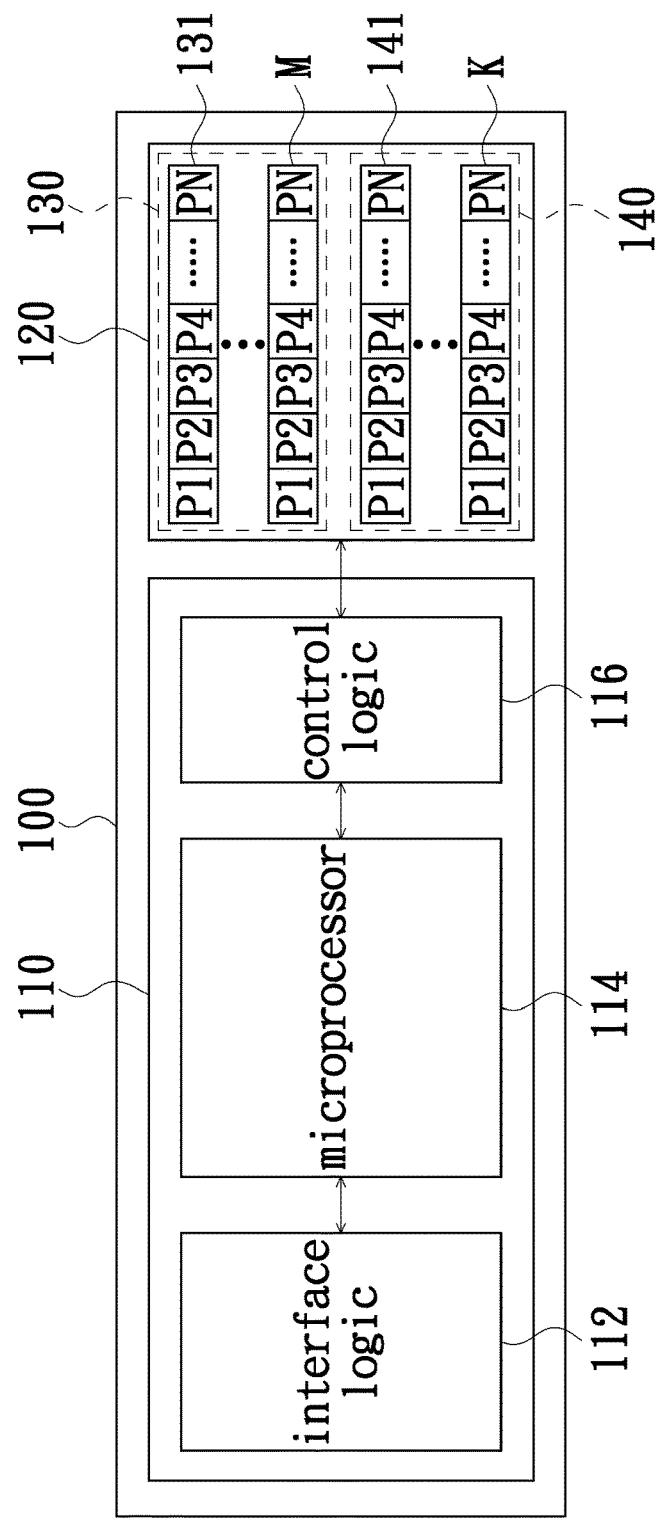
FIG. 1 is a schematic circuit block view of a storage device in accordance with an embodiment of the present invention.

FIG. 1 is a schematic circuit block view of a storage device in accordance with an embodiment of the present invention. As shown in FIG. 1, the storage device 100 of the present embodiment mainly includes a control unit 110 and a data storage medium 120. The data storage medium 120 logically includes an in-use block pool 130 and a spare block pool 140. The spare block pool 140 is for storing spare blocks not written with any (valid) data, such as the spare blocks 141-K; wherein K is a natural number. Once a spare block is written and filled with data, the spare block is re-defined as an in-use block, such as the in-use blocks 131-M, and moved to the in-use block pool 130; wherein M is a natural number. When a garbage collection process is performed, the data in a plurality of related in-use blocks is written to a spare block. Then, after a data erase process is performed, the plurality of in-use blocks are re-defined as spare blocks and moved to the spare block pool 140; and the spare block with written data is re-defined as an in-use block and moved to the in-use block pool 130. Therefore, it is understood that both of the spare blocks 141-K and the in-use blocks 131-M are essentially physical blocks and can be interchanged logically. That is, the logical amount of the in-use blocks can be adjusted according to a user's requirement. As shown in FIG. 1, each in-use block logically includes a plurality of data pages such as the data pages P1, P2, P3, P4, . . . , and PN, wherein N is a natural number. In the present embodiment, the data storage medium 120 is realized by a non-volatile random-access memory with longer data retention time, such as flash memory, magnetoresistive random access memory (Magnetoresistive RAM), ferroelectric random access memory (Ferroelectric RAM), etc.

As shown in FIG. 1, the control unit 110 is electrically coupled to the data storage medium 120 and configured to control an operation (e.g., data access or erase) of the data storage medium 120. In the present embodiment, the control unit 110 includes an interface logic 112, a microprocessor 114 and a control logic 116. The microprocessor 114 is electrically coupled to the interface logic 112, via which the microprocessor 114 is configured to receive commands (e.g., write command, read command, erase command, etc.) or data from a host (e.g., an electronic device such as computer, mobile phone or digital camera with arithmetic function [not shown]). The microprocessor 114 is further electrically coupled to the data storage medium 120 via the control logic 116. The microprocessor 114 is further configured to perform data access or data erase on the data storage medium 120 via the control logic 116.

In the present embodiment, when receiving a write command and data from a host, the microprocessor 114 would first determine whether the received data is sequential data. Herein, the sequential data means that the logic block addresses (LBA) corresponding thereto are sequentially continuous. In addition, the number of sequentially-continuous logic block address for the determination of sequential data is not necessarily set to two and may be set to other values according to a user's requirement. For example, if the number of sequentially-continuous logic block address for the determination of sequential data is set to four, the microprocessor 114 would only determine the data with more than four sequentially-continuous logic block addresses as sequential data; otherwise non-sequential data would be determined. Then, the microprocessor 114 adopts a data storage mean for the data storage medium 120 specific to the determination result of the received data.

When it is determined that the data from a host is not sequential data, the microprocessor 114 selects one spare block from the spare block pool 140 via the control logic 116 and writes the data into two data pages of the selected spare block via the control logic 116, respectively. For example, the microprocessor 114 first selects the spare block 141 from the spare block pool 140 via the control logic 116, and then writes the received data into the data page P1 as well as a backup into the data page P2 of the spare block 141. In other words, both of the received data and the backup thereof are stored in the same spare block 141. In one preferred embodiment, the data page P1 and the data page P2 are two adjacent data pages, as illustrated in FIG. 1. However, the data page P1 and the data page P2 are not necessarily adjacent to each other in another embodiment; for example, the microprocessor 114 may use a specific equation or a random number generator to select the two data pages, but the present invention is not limited thereto. In addition, the number of backup can be more than one. In one embodiment, for example, the number of backup is two and the microprocessor 114 may further write the received data (another backup) into the data page P3 of the spare block 141. Similarly, the received data and the two backups thereof are stored in the same spare block 141.

To comply with the management of wear leveling, the spare block 141 having the least number of data erase or having the longest time since the last data erase may be selected among the spare blocks 141-K in the spare block pool 140.

Alternatively, when it is determined that the data from a host is sequential data, the microprocessor 114 selects two spare blocks from the spare block pool 140 via the control logic 116 and writes the data into the two selected spare blocks via the control logic 116, respectively. For example, the microprocessor 114 first selects the spare blocks 142, 143 from the spare block pool 140 via the control logic 116, and then writes the received data into the data page P1 of the spare block 142 as well as a backup into the data page P1 of the spare block 143.

When the two selected spare blocks are written and filled with data (i.e., all the data pages thereof are written and filled with data), the microprocessor 114 then starts a data verification process; that is, the microprocessor 114 uses error correcting code to perform a correcting operation on the data in each data page of the two spare blocks. When any one of the data pages in any spare block has an error correcting code invalid issue, that spare block is determined as having an error correcting code invalid issue. Then, the microprocessor 114 determines whether to perform a data integration on the two spare blocks according to whether an error correcting code invalid issue is present. In addition, for specific purposes, the microprocessor 114 may initiate write of dummy data into the blank data page in a spare block, so as to allow the spare block written and filled with data to enter the data verification process.

When the data verification process is performed and it is determined that both of the two selected spare blocks do not have an error correcting code invalid issue or only one spare block has an error correcting code invalid issue, then the microprocessor 114 re-defines the spare block (or one of the spare blocks) not having the error correcting code invalid issue as an in-use block and moves the in-use block into the in-use block pool 130 via the control logic 116. The remaining spare block is recycled; that is, the remaining spare block is erased and moved to the spare block pool 140.

Herein the microprocessor 114 selecting the spare blocks 142 and 143 is taken as an example. In this example, it is assumed that both of the spare blocks 142, 143 are written and filled with data and that the spare block 142 has an error correcting code invalid issue whereas the spare block 143 does not have so. Then, the microprocessor 114 re-defines the spare block 143 as an in-use block and moves this in-use block into the in-use block pool 130 via the control logic 116. In addition, the microprocessor 114 erases the data in the spare block 142 and moves the spare block 142 into the spare block pool 140 via the control logic 116.

Alternatively, when the data verification process is performed and it is determined that both of the two selected spare blocks have an error correcting code invalid issue, then the microprocessor 114 further selects one spare block (referred to as the third spare block) from the spare block pool 140 and stores the data in the data pages not having an error correcting code invalid issue in the two selected spare blocks that are written and filled with data into the data pages in the third spare blocks. Then, when the third spare block is written and filled with data and verified by the data verification process, the microprocessor 114 defines the third spare block as an in-use block and moves the third spare block into the in-use block pool 130. Then, the two selected spare blocks are erased and moved to the spare block pool 140.

Herein the microprocessor 114 selecting the spare blocks 142 and 143 is taken as an example. In this example, it is assumed that both of the spare blocks 142, 143 are written and filled with data; the data pages P1, PN in the spare block 142 have an error correcting code invalid issue; the data page P1, PN in the spare block 143 does not have an error correcting code invalid issue; the data pages P2, PN−1 in the spare block 143 have an error correcting code invalid issue; and the data page P2, PN−1 in the spare block 142 does not have an error correcting code invalid issue. Then, the microprocessor 114 further selects one spare block (e.g., the spare block 144) from the spare block pool 140 as the third spare block and stores the data in the data pages P2-PN−1 of the spare block 142 and the data pages P1, PN of the spare page 143, into the spare block 144. During the data verification process and after the data is written into the spare block 144, the microprocessor 114 may further re-verify the data to make sure the data has been correctly written into the spare block 144. If it is determined that the data page in the spare block 114 also has the error correcting code invalid issue, the microprocessor 114 further selects one spare block (e.g., the spare block 145) from the spare block pool 140 via the control logic 116, refers the selected spare block 145 as the third spare block, and then repeats the aforementioned process. Then, when the third spare block is written and filled with data and verified by the data verification process, the microprocessor 114 defines the third spare block as an in-use block and moves the third spare block into the in-use block pool 130. In addition, the microprocessor 114 erases the data of the spare blocks 142, 143 and moves the spare blocks 142, 143 into the spare block pool 140 via the control logic 116.

Figure 2:
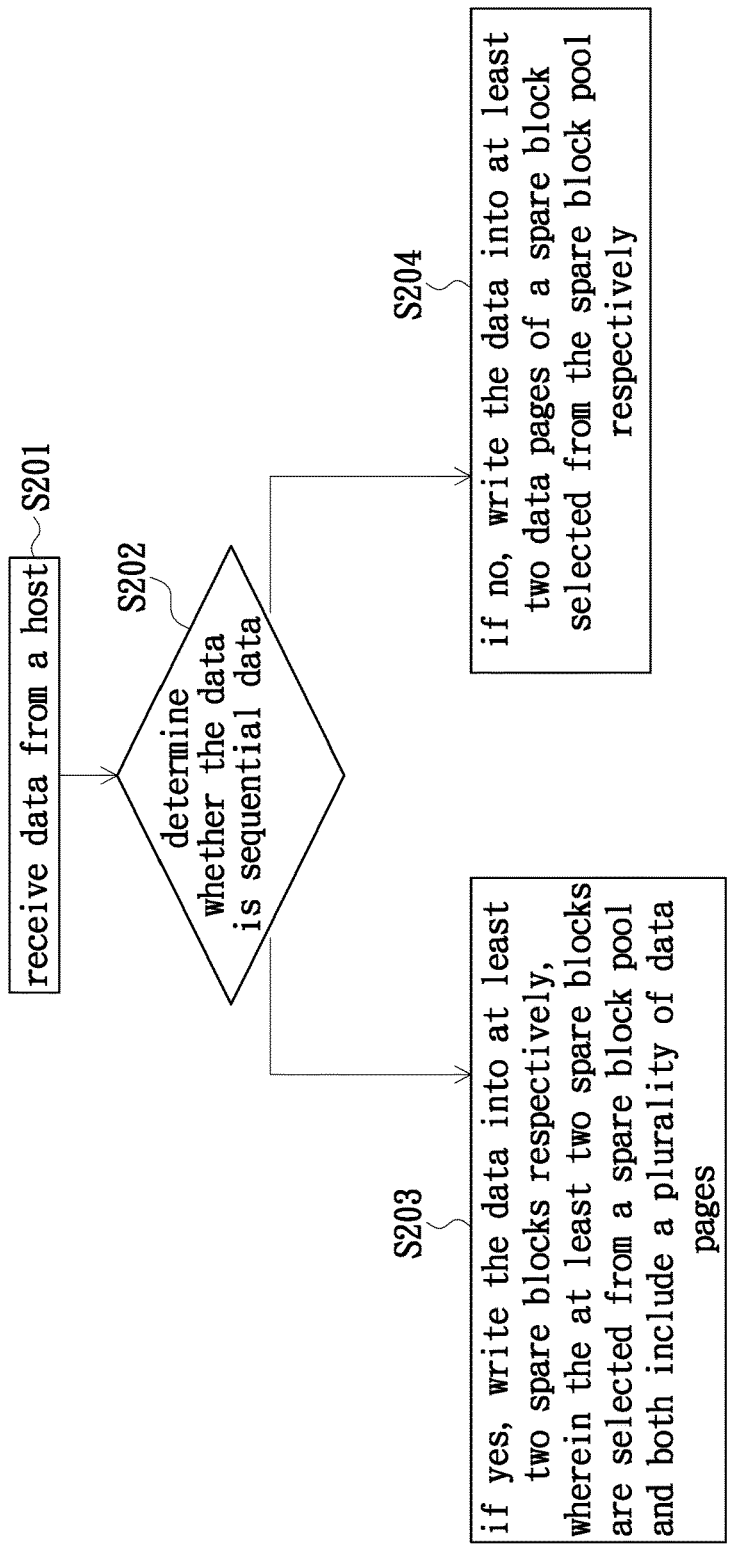
FIG. 2 is a flowchart of a data storing method for a storage device in accordance with an embodiment of the present invention.

A data storing method for a storage device can be developed according to the above teachings. FIG. 2 is a flowchart of a data storing method for a storage device in accordance with an embodiment of the present invention. As shown in FIG. 2, the data storing method for a storage device of the present embodiment includes steps of: first, receiving data from a host (step S201); then, determining whether the data is sequential data (step S202); if yes, writing the data into at least two spare blocks respectively, wherein the at least two spare blocks are selected from a spare block pool and both include a plurality of data pages (step S203); alternatively, if no, writing the data into at least two data pages of a spare block selected from the spare block pool respectively (S204).

In summary, when performing a data write operation, the present invention would make a backup of the written data. Therefore, once any one of these two data has an error correcting code invalid issue, the present invention may select and store another data not having the error correcting code invalid issue g. Or, if both of these two data have the error correcting code invalid issue, the present invention may integrate the pieces of these two data to form one data without the error correcting code invalid issue. As a result, data loss is avoided.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A storage device, comprising:
 a data storage medium, comprising a spare block pool, wherein the spare block pool comprises a plurality of spare blocks, and each one of the plurality of spare blocks comprises a plurality of data pages; and
 a control unit, electrically coupled to the data storage medium, wherein the control unit is configured to receive data from a host and to determine whether the data is sequential data according to a default policy, and if the determination is false, the data is written into at least two of the plurality of data pages in one of the plurality of spare blocks respectively.

2. The storage device according to claim 1, wherein if the data is determined as sequential data, the control unit is configured to write the data into at least two of the plurality of spare blocks respectively.

3. The storage device according to claim 1, wherein a plurality of logic block addresses corresponding to the sequential data are sequentially continuous.

4. The storage device according to claim 1, wherein when the at least two spare blocks are written and filled with the data, the control unit is configured to perform a data verification process on the at least two spare blocks.

5. The storage device according to claim 4, wherein when the data verification process is performed, one of the at least two spare blocks not having an error correcting code invalid issue is re-defined as an in-use block.

6. The storage device according to claim 4, wherein when the data verification process is performed and the at least two spare blocks are determined to have an error correcting code invalid issue, the control unit is configured to store the data in the data pages in the at least two spare blocks not having the error correcting code invalid issue into a third spare block.

7. The storage device according to claim 1, wherein the default policy is to check whether the data has a number of sequentially-continuous logic block addresses.

8. The storage device according to claim 1, wherein the at least two of the plurality of data pages in one of the plurality of spare blocks are not physically adjacent.

9. A control unit, comprising:
 a control logic, the control logic being electrically coupled to a data storage medium, wherein the data storage medium comprises a spare block pool, the spare block pool is for storing a plurality of spare blocks, and each one of the plurality of spare blocks comprises a plurality of data pages; and
 a microprocessor, electrically coupled to the control logic, wherein the microprocessor is configured to receive data from a host and determine whether the data is sequential data, wherein if the determination is true, the microprocessor is configured to write the data into at least two of the plurality of spare blocks via the control logic respectively, wherein if the determination is false, the microprocessor is configured to write the data into at least two of the plurality of data pages in one of the plurality of spare blocks via the control logic respectively.

10. The control unit according to claim 9, wherein a plurality of logic block addresses corresponding to the sequential data are sequentially continuous.

11. The control unit according to claim 9, wherein when the at least two spare blocks are written and filled with the data, the microprocessor is configured to perform a data verification process on the at least two spare blocks.

12. The control unit according to claim 11, wherein when the data verification process is performed by the microprocessor, one of the at least two spare blocks not having an error correcting code invalid issue is re-defined as an in-use block.

13. The control unit according to claim 11, wherein when the at least two spare blocks are determined to have an error correcting code invalid issue, the microprocessor is configured to store the data in the data pages in the at least two spare blocks not having the error correcting code invalid issue into a third spare block.

14. A data storing method for a storage device, comprising steps of:
 receiving data from a host;
 determining whether the data is sequential data;
 if the determination is true, writing the data into at least two spare blocks respectively, wherein the at least two spare blocks are selected from a plurality of spare blocks of a spare block pool, and each one of the plurality of spare blocks comprises a plurality of data pages; or
 if the determination is false, writing the data into at least two of the plurality of data pages in one of the plurality of spare blocks in the spare block pool respectively.

15. The data storing method for a storage device according to claim 14, wherein a plurality of logic block addresses corresponding to the sequential data are sequentially continuous.

16. The data storing method for a storage device according to claim 14, further comprising a step of:
 when the at least two spare blocks are written and filled with the data, performing a data verification process on the at least two spare blocks.

17. The data storing method for a storage device according to claim 16, further comprising a step of:
 when the data verification process is performed, defining one of the at least two spare blocks not having an error correcting code invalid issue as an in-use block.

18. The data storing method for a storage device according to claim 16, further comprising a step of:
 when the data verification process is performed and the at least two spare blocks are determined to have an error correcting code invalid issue, storing the data in the data pages in the at least two spare blocks not having the error correcting code invalid issue into a third spare block.

* * * * *